(12) United States Patent
Jeong et al.

(10) Patent No.: US 11,728,125 B2
(45) Date of Patent: Aug. 15, 2023

(54) ULTRAFAST ELECTRON DIFFRACTION APPARATUS

(71) Applicant: KOREA ATOMIC ENERGY RESEARCH INSTITUTE, Daejeon (KR)

(72) Inventors: Young Uk Jeong, Daejeon (KR); Nikolay Vinokurov, Daejeon (KR); Hyun Woo Kim, Daejeon (KR); Ki Tae Lee, Sejong-si (KR); Kyuha Jang, Daejeon (KR); Inhyung Baek, Daejeon (KR)

(73) Assignee: Korea Atomic Energy Research Institute, Daejeon (KR)

( * ) Notice: Subject to any disclaimer, the term of this patent is extended or adjusted under 35 U.S.C. 154(b) by 404 days.

(21) Appl. No.: 17/126,904

(22) Filed: Dec. 18, 2020

(65) Prior Publication Data

US 2021/0193429 A1 Jun. 24, 2021

(30) Foreign Application Priority Data

Dec. 20, 2019 (KR) .......................... 10-2019-0172374

(51) Int. Cl.
*H01J 37/14* (2006.01)
*H01J 37/073* (2006.01)

(52) U.S. Cl.
CPC ............ *H01J 37/14* (2013.01); *H01J 37/073* (2013.01)

(58) Field of Classification Search
CPC ................................. H01J 37/14; H01J 37/073
See application file for complete search history.

(56) References Cited

U.S. PATENT DOCUMENTS

2012/0312987 A1* 12/2012 Tokita ............... G01N 23/20058
250/307
2019/0333731 A1 10/2019 Mohammed

FOREIGN PATENT DOCUMENTS

| JP | 2018-146265 A | 9/2018 |
| KR | 10-2018-0060243 A | 6/2018 |
| WO | WO-2011/093285 A1 | 8/2011 |

OTHER PUBLICATIONS

Setiniyaz, S, et al., "Beam Characterization at the KAERI UED Beamline." *Journal of Korean Physical Society*, Sep. 2016, vol. 69, No. 6, pp. 1019-1024.
Kim, H W, et al. "Characterization of Electron Bunches in Ultrafast Electron Diffraction Beamlines at KAERI,." 2017 FEL Conference, Aug. 23, 2017.

* cited by examiner

*Primary Examiner* — Joseph L Williams
(74) *Attorney, Agent, or Firm* — Harness, Dickey & Pierce, P.L.C.

(57) ABSTRACT

There is provided an ultrafast electron diffraction apparatus including: a photoelectron gun configured to emit an electron beam; a bending portion for emitting the electron beam emitted from the photoelectron gun by changing a travel direction of the electron beam by a predetermined angle; and a sample portion including a sample to be analyzed by the electron beam emitted from the bending portion. The electron beam reaches the sample portion in a state that a pulse of the electron beam is compressed and the timing jitter between the pumping light and probe electron pulse is completely reduced as the travel direction of the electron beam is changed by the predetermined angle through the bending portion.

18 Claims, 8 Drawing Sheets

ULTRAFAST ELECTRON DIFFRACTION APPARATUS

CROSS-REFERENCE TO RELATED APPLICATIONS

This application is based on and claims priority from Korean Patent Application No. 10-2019-0172374 filed on Dec. 20, 2019, the disclosures of which are incorporated herein in its entirety by reference for all purposes.

TECHNICAL FIELD

The present disclosure relates to an ultrafast electron diffraction apparatus, and more particularly, to an ultrafast electron diffraction apparatus for controlling a state of an electron beam generated in a radio-frequency (RF) photoelectron gun.

BACKGROUND

When an electromagnetic wave or a matter wave having a short wavelength such as an X-ray or an electron beam is used, a user can directly observe a structure of an atom or a molecule. Representative technology for this is an electron microscope.

In addition to this technology, by generating and using both pumping light stimulating the sample and an electron beam or X-ray which are probe beams that observe dynamics of molecular structure of a sample, in an ultra-short period of time, a structural change of the molecules in the sample may be measured. When measuring the molecule's structural change of the sample, time-resolved diffraction technology is used, and pumping light generally uses an ultrashort laser light source, and the probe beam uses high energy electromagnetic waves or matter waves such as X-rays or electron beams.

Recently, in the case of using ultrafast electron diffraction (UED) technology that uses relativistic electrons and X-ray free-electron laser (X-FEL), which is the 4-th generation synchrotron radiation, the structural change of the sample's molecules may be observed with time accuracy of about 100 femtoseconds (fs) in atomic or molecular units.

The above-described X-FEL and UED technology use ultrashort X-rays or ultrashort electron beams, respectively, as tools for reading structural changes of atoms and molecules. X-FEL technology is appropriate for studies of large molecules or thick samples such as biological or complex materials, and UED technology is appropriate for studies of samples with small-sized molecules, thin films, and gas phases. That is, the X-FEL and UED technology may have complementary roles.

The main technical challenges of the above technologies are to improve time accuracy and brightness of the beam. In order to improve the time accuracy, it is necessary to further shorten pulse duration of x-ray or electron beam and reduce timing jitter between pump and probe pulses. Further, in order to improve the brightness of the x-ray or electron beam, the output power of X-ray pulse and the charge of the electron beam should be increased.

In UED, shortening of the electron pulse, which is used as a probe, is limited by space charge force, which is a repulsive force among negatively charged electrons gathered in the pulse. When more electrons are used for increasing brightness of the electron beam, the space charge force of the electron beam increases, and thus the pulse duration of the electron beam increases rapidly even if the electron beam travels a small distance.

By increasing the kinetic energy of the electron beam, the velocity of electrons approaches the velocity of light and thus the space-charge effect decreases. When acceleration energy is too high, a size of an apparatus increases rapidly and thus it is known that the energy of a few millions of electron volts (MeV) of electron beam is appropriate for the UED experiment. In conventional technologies, in order to minimize the pulse duration increase of electron beam by the space charge force, the ultrafast electron diffraction apparatus uses a short linear structure. Further, some ultrafast electron diffraction apparatuses may additionally use an RF cavity in order to compress the electron beam. When the electron beam is compressed using the RF cavity, there is a problem that a phase of the RF in the cavity is fluctuated due to the temperature change of the RF cavity and the instability of the RF electric field. In this case, there is a problem that time accuracy is generally deteriorated because timing jitter in which the electron beam reaches the sample increases.

An ultrafast electron diffraction apparatus using an RF photoelectron gun and a linear structure has a problem that low electron pulse charge of 10 femtocoulombs (fC) or less should be used for obtaining an electron beam pulse of about 100 femtoseconds. Further, in the case of using such a linear structure, as the ultrafast electron diffraction apparatus is configured with one beamline, there is a problem that an experiment apparatus should be newly installed and used each time when a plurality of users use the ultrafast electron diffraction apparatus.

PRIOR ART DOCUMENT

Japanese Laid-Open Patent No. 2018-146265 (Sep. 20, 2018)

SUMMARY

In view of the above, the present disclosure provides an ultrafast electron diffraction apparatus capable of solving limitations such as time accuracy, beam brightness, and number of beamlines, and controlling a state of an electron beam generated in an RF photoelectron gun.

In accordance with a first embodiment of the present disclosure, there is provided an ultrafast electron diffraction apparatus including: a photoelectron gun configured to emit an electron beam; a bending portion for emitting the electron beam emitted from the photoelectron gun by changing a travel direction of the electron beam by a predetermined angle; and a sample portion including a sample to be analyzed by the electron beam emitted from the bending portion, wherein the electron beam reaches the sample portion in a state that a pulse of the electron beam is compressed as the travel direction of the electron beam is changed by the predetermined angle through the bending portion.

In accordance with a second embodiment of the present disclosure, there is provided an ultrafast electron diffraction apparatus including: a photoelectron gun configured to independently emit an electron beam multiple times at time intervals; a bending portion for emitting the electron beam emitted from the photoelectron gun by changing a travel direction of the electron beam by a predetermined angle; and a sample portion including a sample to be analyzed by the electron beam emitted from the bending portion, wherein a plurality of electron beams independently emitted to the sample portion and having different average energies reach with a reduced timing jitter to less than a few femtosecond according to selection of an RF phase of the photoelectron gun and an angle change of the electron beam through the bending portion.

According to the present disclosure, it is possible to simultaneously measure a structure and motion of atoms or molecules of a substance, and while improving time accuracy compared to the prior art, brightness of an electron beam can be improved by about 100 times compared to the prior art.

In particular, when using an RF photoelectron gun, there is an effect of fundamentally arriving timing jitter of the relative difference of a time in which an electron beam and a laser beam reach a sample.

DETAILED DESCRIPTION

Figure 1:
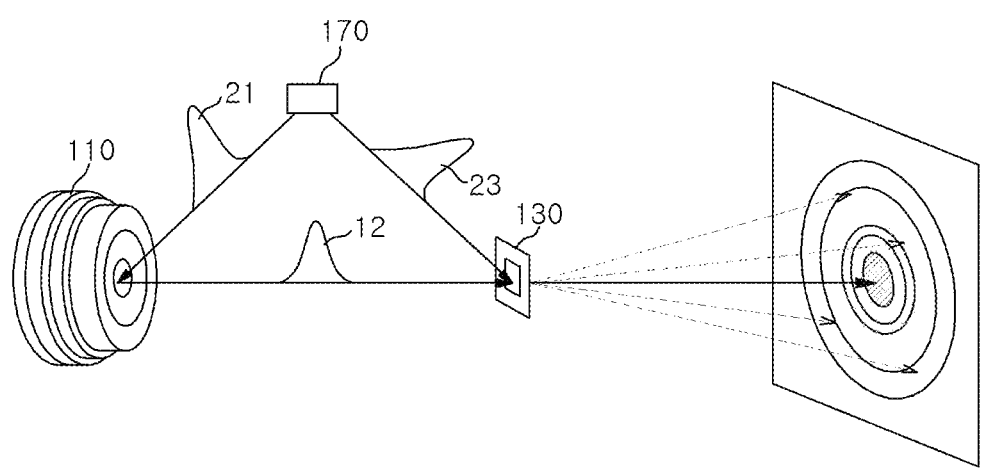
FIG. 1 is a diagram illustrating the principle of ultrafast electron diffraction (UED) technology using a photoelectron gun.

Hereinafter, configurations and operations of embodiments will be described in detail with reference to the accompanying drawings. The following description is one of various patentable aspects of the disclosure and may form a part of the detailed description of the disclosure.

However, in describing the present disclosure, detailed descriptions of known configurations or functions may be omitted to clarify the present disclosure.

The disclosure may be variously modified and may include various embodiments. Specific embodiments will be exemplarily illustrated in the drawings and described in the detailed description of the embodiments. However, it should be understood that they are not intended to limit the disclosure to specific embodiments but rather to cover all modifications, similarities, and alternatives which are included in the spirit and scope of the disclosure.

The terms used herein, including ordinal numbers such as "first" and "second" may be used to describe, and not to limit, various components. The terms simply distinguish the components from one another.

When it is said that a component is "coupled" or "linked" to another component, it should be understood that the former component may be directly connected or linked to the latter component or a third component may be interposed between the two components.

Specific terms used in the present application are used simply to describe specific embodiments without limiting the disclosure. An expression used in the singular encompasses the expression of the plural, unless it has a clearly different meaning in the context.

A preferred embodiment of the present disclosure will be described in more detail with reference to the accompanying drawings.

Figure 2:
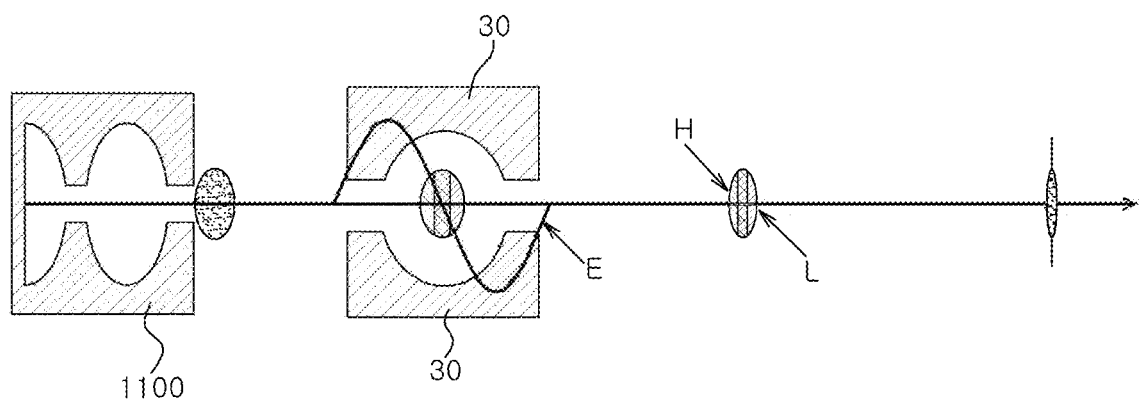
FIG. 2 is a diagram illustrating technology for compressing an electron beam using an RF cavity in conventional UED technology.
Figure 3:
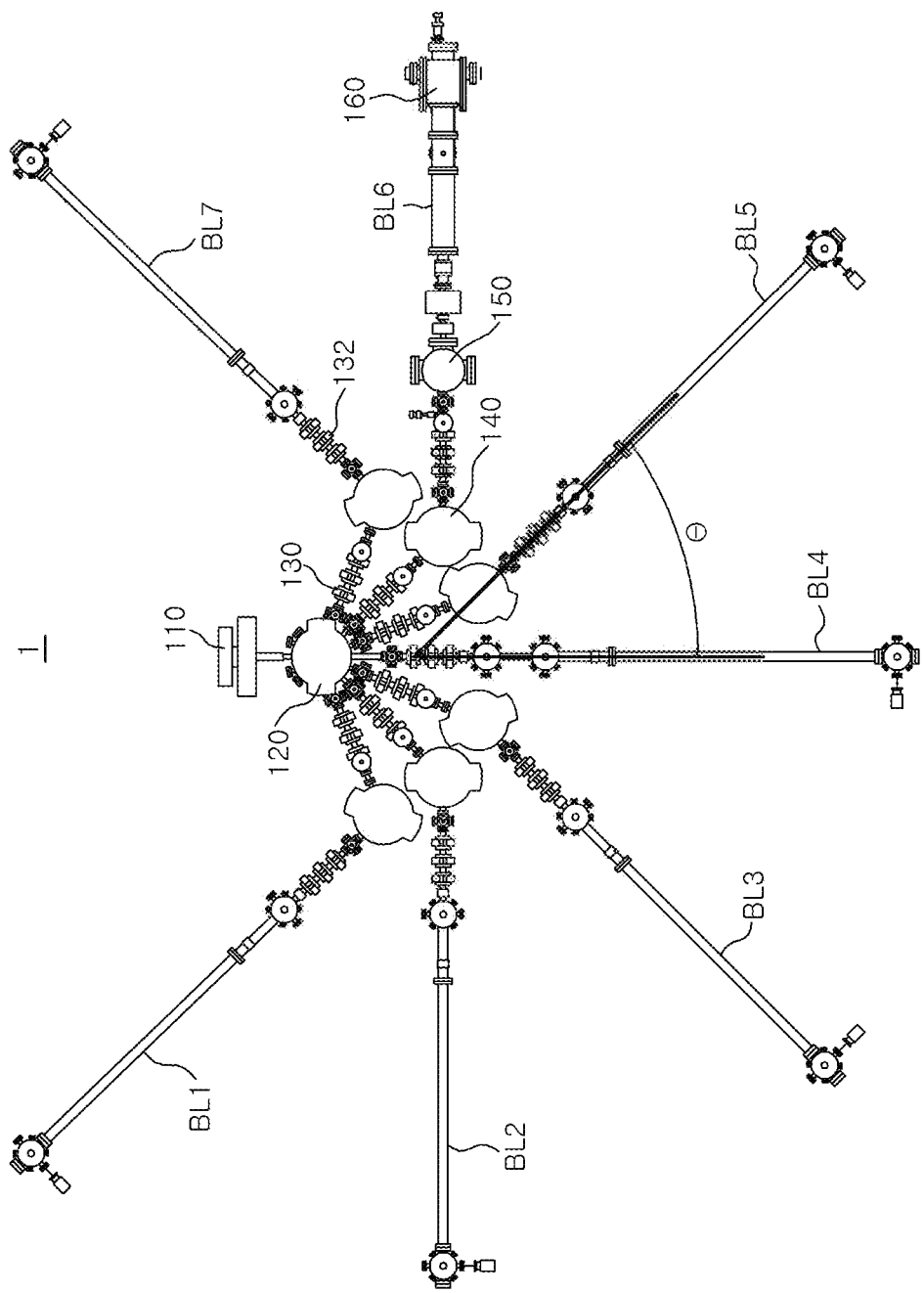
FIG. 3 is a diagram illustrating a configuration of an ultrafast electron diffraction apparatus on the same plane according to an embodiment of the present disclosure.

FIG. 1 is a diagram illustrating the principle of ultrafast electron diffraction (UED) technology using a photoelectron gun. FIG. 2 is a diagram illustrating technology for compressing an electron beam using an RF cavity in conventional UED technology. FIG. 3 is a diagram illustrating a configuration of an ultrafast electron diffraction apparatus on the same plane according to an embodiment of the present disclosure.

Referring to FIG. 1, ultrafast electron diffraction technology will be described in more detail. First, X-ray free-electron laser technology uses a very large scientific facility that has a length of about 1 km or more and that costs one billion USD in a construction cost. However, ultrafast electron diffraction technology may be installed in laboratories with dimensions of tens of meters. The ultrafast electron diffraction apparatus can be constructed at a very low cost compared to the X-ray free-electron laser facility because equipment to implement ultrafast electron diffraction technology does not exceed 10 millions of USD. The key to the development of ultrafast electron diffraction is to obtain equivalent time and brightness performance, compared to those of X-ray free-electron lasers.

As illustrated in FIG. 1, an ultrafast electron diffraction apparatus 1 includes a photoelectron gun 110 that emits an electron beam 12 toward a sample and a light source unit 170 that emits light. In this case, light emitted from the light source unit 170 is diverged into two femtosecond laser pulses, and one femtosecond laser pulse is wavelength-converted into ultraviolet rays 21 and enters the photoelectron gun 110. The photoelectron gun 110 generates an electron beam pulse used as a probe using the incident ultraviolet rays 21 to emit the electron beam 12. The other femtosecond laser pulse is radiated to the sample to be used for pumping (exciting or stimulating) the sample. By adjusting a path of pumping light 23 radiated to the sample in this way, it is possible to observe temporal changes in a structure of atoms and molecules in the sample after pumping.

In both the X-ray free-electron laser technology and the ultrafast electron diffraction technology, it is important to improve time accuracy and brightness of the electron beam 12, and time accuracy or a time resolution $\tau$ is represented by Equation 1.

$$\tau = \sqrt{\tau_{pump}^2 + \tau_{probe}^2 + \tau_{jitter}^2 + \tau_{VM}^2} \qquad \text{(Equation 1)}$$

Here, $\tau_{pump}$ is a pulse duration (a length of a pulse in a time unit) of the pumping light 23, $\tau_{probe}$ is a pulse duration of the electron beam (or X-ray) 12 as a probe, $\tau_{jitter}$ is timing jitter in which the pumping light 23 and the electron beam 12 as the probe reach a sample, and $\tau_{VM}$ indicates an increase in an effective pulse duration by the difference in speed between the electron beam 12 and the ultraviolet ray 21 while passing through the sample.

It is known that it is difficult to reduce $\tau_{jitter}$ in X-ray free-electron laser technology using an RF accelerator and relativistic ultrafast electron diffraction technology.

The brightness of the electron beam 12 is determined according to the number of photons or electrons included in the pulse. In general, since, in the X-ray free-electron laser technology, about $10^{12}$ photons are included in a single pulse, it is possible to observe the molecular dynamics of a material with a single pulse.

Since electrons, which are charged particles, have scattering power that is about 100,000 to 1 million times more stronger than X-rays, when about $10^6$ electrons per pulse are used for exploring the materials, they may exhibit similar performance as that of X-ray free-electron laser technology. However, when electrons, which are charged particles, are gathered in a very small space-time with a certain amount of charges or more, a space charge force that pushes against each other occurs strongly, and for this reason, a problem may occur that the characteristics of the electron beam 12 deteriorate and that the pulse width rapidly increases.

Accordingly, in relativistic ultrafast electron diffraction technology developed so far, by generating an electron beam 12 with a pulse width of about 100 femtoseconds in the RF photoelectron gun 110, and locating the sample as close as possible in a linear path of the electron beam 12, an apparatus developed to minimize expanding phenomenon of the electron beam 12 is used. Nevertheless, in an apparatus according to such ultra-fast electron diffraction technology, the degree in which a pulse width of the electron beam 12 increases and how many electrons are included in a single pulse act as important factors.

When the electron beam 12 includes about $10^5$ or more electrons per pulse or when the electron beam 12 is dozens of femtocoulombs (fC) or more, the electron beam 12 rapidly increases a pulse width even if it travels about 1 m. Accordingly, as illustrated in FIG. 2, technology of compressing the electron beam 12 using an RF cavity 30 is used. A first RF cavity 1100 and a second RF cavity 30 are illustrated in FIG. 2, and an electric field (E) formed in the second RF cavity 30 is used for decelerating front side electrons moving at the front side in a direction of travel of the electron beam 12 by changing the front side electrons into a relatively low-energy eletrons (L), and accelerating back side electrons moving at the back side in the direction of travel of the electron beam 12 by changing the front side electrons into a relatively high-energy eletrons (H). In this way, the degree of acceleration and deceleration of electrons in the electron beam 12 is formed linearly according to a position of a longitudinal axis in the pulse of the electrons. Such a velocity distribution of the electron beam 12 is referred to as a positive chirp.

Accordingly, while the electron beam 12 travels for a predetermined distance, electrons traveling in the front move relatively slowly, and electrons traveling in the back move relatively quickly and thus electrons may gather at the center position of the electron pulse. Such gathering of electrons is referred to as velocity compression or ballistic compression.

As described above, the phase of the RF in the second RF cavity 30 used for velocity compression or ballistic compression may fluctuate according to the changes of temperature or environment, thereby increasing timing jitter in which the electron beam 12 reaches the sample.

Accordingly, as illustrated in FIG. 3, the ultrafast electron diffraction apparatus 1 according to the embodiment of the present disclosure is used. Referring to FIG. 3, the ultrafast electron diffraction apparatus 1 according to the embodiment of the present disclosure includes a photoelectron gun 110, bending portions 120 and 140, a first quadrupole magnet module 130, a second quadrupole magnet module 132, a sample portion 150, a detection unit 160, and a light source unit 170 (not shown). In this case, the bending portions 120 and 140 include a main bending portion 120 and an auxiliary bending portion 140. A plurality of auxiliary bending portions 140 may be provided and be interlocked with one main bending portion 120. Further, the ultrafast electron diffraction apparatus 1 may include a plurality of beamlines.

The photoelectron gun 110 emits an electron beam having predetermined energy using a pulsed RF signal. In the present embodiment, the electron beam emitted from the photoelectron gun 110 has energy of about 2 MeV to 4 MeV, and has a bunch charge of about 1 pC and bunch duration of about 100 fs. In the present embodiment, when a diameter of the electron beam emitted from the photoelectron gun 110 is about 150 μm to 500 μm and when bunch duration is about 50 fs to 300 fs, a bunch charge may be about 0.1 pC to 5 pC.

The light source unit 170 emits ultraviolet rays 21 for generating electron beam pulses used as probes in the photoelectron gun 110, and also emits pumping light 23 for pumping (excitating, stimulating) a sample toward the sample portion 150. In this case, the light source unit 170 diverges light. Further, the light source unit 170 converts a part of the diverged light into ultraviolet rays 21 to emit it toward the photoelectron gun 110, and applies another part of the diverged light as pumping light to the auxiliary bending portion 140 to travel toward the sample portion 150.

In the present embodiment, a light diverged from the light source unit 170 and emitted as the ultraviolet ray 21 may be directly radiated to the photoelectron gun 110. Another light among the diverged lights may be emitted toward the sample portion 150 as pumping light 23, and the pumping light 23 may be emitted toward the sample portion 150 through the auxiliary bending portion 140. A detailed description thereof will be described later.

The main bending portion 120 is disposed at the rear end of the photoelectron gun 110, and the electron beam emitted from the photoelectron gun 110 is moved to the main bending portion 120. The main bending portion 120 is configured with a dipole magnet, and may adjust magnetic field strength of the dipole magnet. Thus, the dipole magnet included in the main bending portion 120 may be a permanent magnet or an electromagnet. Further, a shape of the main bending portion 120 may be formed in a circular shape, a square shape, or other shapes.

The main bending portion 120 changes an emitting angle of the electron beam coming from the photoelectron gun 110 according to the strength of the applied magnetic field. In the present embodiment, the main bending portion 120 may change the electron trajectories with a bending angle θ such as about 0°, 22.5°, 45°, and 67.5° on a predetermined plane. Here, the bending angle θ changed on the plane is an angle between an incident direction (e.g., a fourth beamline BL4) in which the electron beam is incident and an emitting direction of the electron beam whose emitting direction is changed, as illustrated in FIG. 3.

Figure 4:
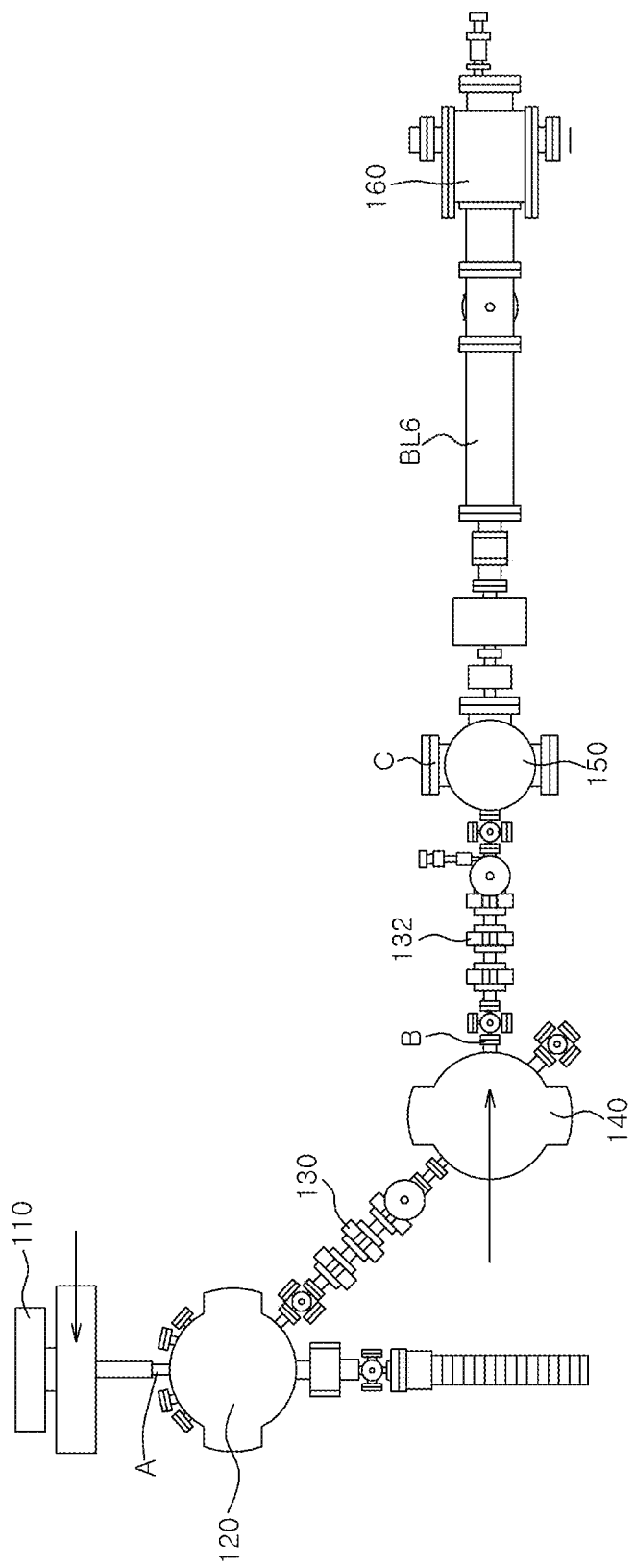
FIG. 4 is a diagram illustrating a state in which a beamline with 90° bend in the ultrafast electron diffraction apparatus according to the embodiment of the present disclosure.

The first quadrupole magnet module 130 is disposed so that one side faces the main bending portion 120 and the other side faces the auxiliary bending portion 140. The first quadrupole magnet module 130 may include three quadrupole magnets disposed between the main bending portion 120 and the auxiliary bending portion 140, as illustrated in FIGS. 3 and 4, and serves to focus electron beams emitted from the main bending portion 120. That is, the first quadrupole magnet module 130 serves as a focusing or a defocusing lens.

The auxiliary bending portion 140 is connected to the first quadrupole magnet module 130, receives the electron beam emitted from the first quadrupole magnet module 130, bends an angle of the electron beam, and then emits the electron beam. In this case, the auxiliary bending portion 140 is configured with a dipole magnet, as in the main bending portion 120, and may adjust magnetic field strength of the dipole magnet. To this end, the dipole magnet included in the auxiliary bending portion 140 may be configured with a permanent magnet or an electromagnet. A shape of the auxiliary bending portion 140 may be formed in a circular shape, a square shape, or other shapes. Further, a plurality of auxiliary bending portions 140 may be provided, and at least some auxiliary bending portions 140 of the plurality of auxiliary bending portions 140 may be configured to place on different virtual planes.

The auxiliary bending portion 140 changes an emitting angle of the electron beam emitted from the first quadrupole magnet module 130 according to the strength of the applied magnetic field. In the present embodiment, the auxiliary bending portion 140 may change an emitting angle of the electron beam to an emitting angle of, for example, about 0°, 22.5°, 45°, and 67.5° on a predetermined plane. In the present embodiment, the emitting angle of the electron beam changed in the auxiliary bending portion 140 may be the same as that of the electron beam changed in the main bending portion 120.

For example, when the main bending portion 120 changes a bending angle of the electron beam to an angle of 22.5°, the auxiliary bending portion 140 may also equally change the bending angle of the electron beam to an angle of 22.5°. Accordingly, a beamline in which the sample portion 150 is disposed may have a bending angle of 45° to the direction of the electron beam emitted from the photoelectron gun 110.

In the present embodiment, the auxiliary bending portion 130 may be omitted, as needed. In this case, a direction of travel of the electron beam emitted from the main bending portion 120 becomes a final direction of travel of the electron beam.

The second quadrupole magnet module 132 has one side connected to the auxiliary bending portion 140 and the other side connected to the sample portion 150. In the present embodiment, three second quadrupole magnet modules 132 are provided and serve to focus the electron beam emitted from the auxiliary bending portion 140.

The sample portion 150 has a sample disposed therein, and an electron beam emitted through the second quadrupole magnet module 132 is incident to the sample portion 150. In the present embodiment, the above-described pumping light 23 together with the electron beam 12 may enter the sample portion 150.

The detection unit 160 detects an electron beam 12 that has passed through the sample portion 150. To this end, the detection unit 160 may analyze the sample included in the sample portion 150 using a screen for the scattered electron beam 12.

In the present embodiment, beamlines BL1 to BL7 are defined as lines in which the auxiliary bending portion 140, the second quadrupole magnet module 132, the sample portion 150, and the detection unit 160 are disposed, and the beamlines BL1 to BL7 may have a linear shape. In other words, the beamlines BL1 to BL7 may be configured such that the electron beam emitted from the auxiliary bending portion 140 travels in a straight line toward the sample portion 150. Therefore, the electron beams emitted from the photoelectron gun 110 are changed in the angles at the main bending portion 120 and the auxiliary bending portion 140, respectively, and then travel to the detection unit 160 through the sample portion 150 in a linear shape through the beamlines BL1 to BL7.

In the present embodiment, for example, when the beamline BL6 is bent by 90°, electron beams generated in the photoelectron gun 110 have about 3.1 MeV, and a length of the beamline BL6 is 3.2 m, energy distribution of the electron beams should satisfy −61 eV/fs. In this case, the length of the beamline BL6 may be 2 m to 5 m, and in this case, in order to compress a predetermined pulse of the electron beam, an energy distribution range of the electron beam may be −60 eV/fs±15%.

This is because the electron beams are compressed and timing jitter is compensated (or significantly reduced) during the electron beams emitted from the photoelectron gun 110 rotate in a direction of travel through the main bending portion 120 and the auxiliary bending portion 140, and thus the sample portion should be disposed at a position in which timing jitter is compensated (or significantly reduced) while the electron beams are maximally compressed. Accordingly, a length of the beamline may be set according to an energy distribution range of the electron beam and the degree of bending of the bending portions 120 and 140.

The ultrafast electron diffraction apparatus 1 having the above configuration is configured to have a plurality of beamlines, as illustrated in FIG. 3, and in this case, compression of electron beams emitted from the photoelectron gun 110 will be described with reference to FIGS. 4 and 5.

Figure 5A:
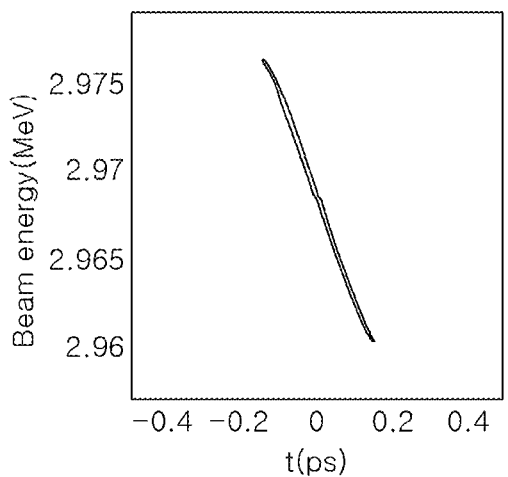
FIGS. 5A to 5C are graphs illustrating a state of compressing an electron beam in the ultrafast electron diffraction apparatus according to the embodiment of the present disclosure.
Figure 5B:
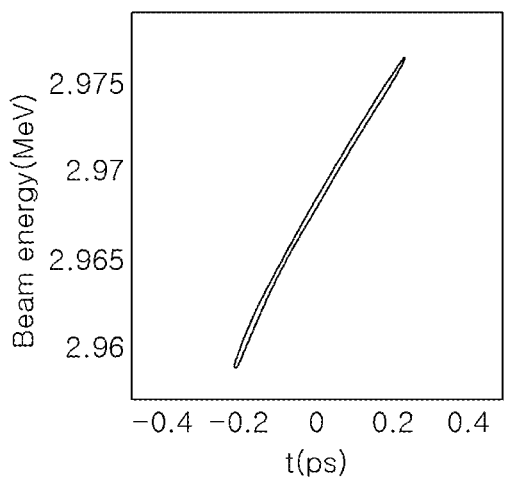
Figure 5C:
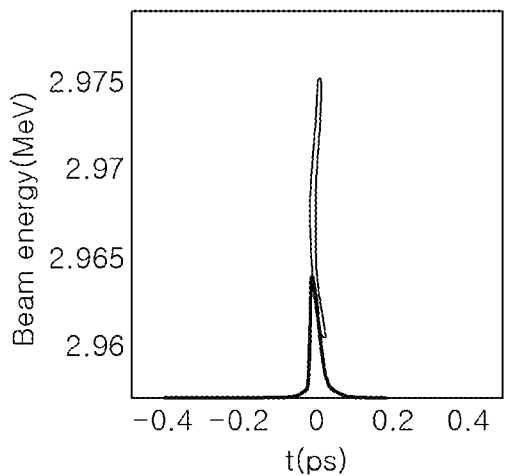

FIG. 4 is a diagram illustrating a state in which a beamline is 90° in an ultrafast electron diffraction apparatus according to the embodiment of the present disclosure. FIGS. 5A to 5C are graphs illustrating a state of compressing an electron beam in an ultrafast electron diffraction apparatus according to the embodiment of the present disclosure.

When the light emitted from the light source unit 170 is diverged and wavelength-converted into ultraviolet rays 21 to be entered into the photoelectron gun 110, electron beams are generated, and the electrin beams can be a negative chirp in pulse energy distribution dut to a space charge force by the charge density of the electron beams. For example, when a charge of about 1 pC is generated in an electron beam space with a pulse duration of 100 fs and a diameter of 0.5 mm, electrons located in the front of the electron beam move faster (increase energy) because of a repulsive force thereof, and electrons located in the back thereof move more slowly (decrease energy). Such velocity distribution is referred to as a negative chirp state.

In this case, as illustrated in FIG. 4, when the electron beam passes through the bending portions 120 and 140 having a predetermined emitting angle (e.g., 90°), fast-speed electrons disposed at the front move in a relatively long path (a path with a large radius of curvature) outside the bending portions 120 and 140, and the slow-speed electrons disposed at the back move in a relatively short path (a path with a small radius of curvature) inside the bending portions 120 and 140. Therefore, the relative position distribution of the electron beam changes, and the slow-speed electrons move in a relatively short path and thus they are located in front of the fast-speed electrons, and the fast-speed electrons move in a long path to be located behind the slow-speed electrons. Such a state is referred to as a positive chirp state. In other words, according to an embodiment of the present disclosure, when the electron beam passes through the bending portions 120 and 140 without applying an RF electric field as in a bunching RF cavity, the electron beam may be in a positive chirp state.

Accordingly, as the electron beams move along a linear beamline through the main bending portion 120 and the auxiliary bending portion 140, all electrons naturally move to be the same position because of the difference in speed of the electrons. In other words, immediately after being emitted from the bending portions 120 and 140, the slow-speed electrons travel in front of the fast-speed electrons, but as they travel through the linear beamline, the fast-speed electrons catch up the slow-speed electrons and thus they travel with little difference in position between each other. Such a movement of electrons so that there is no positional difference between them is referred to as velocity compression or ballistic compression. In other words, the electrons pass through the bending portions 120 and 140 and then travel through the linear beamline, thereby moving with the same position or a relative position within a predetermined range of error. The sample portion 150 including the sample is disposed at a point where electrons of the electron beam (pulse of the electron beam) are maximally compressed.

In this case, a graph illustrated in FIG. 5A shows a negative chirp state of the electron beam at a position A where the electron beam is emitted from the photoelectron gun 110, and a graph illustrated in FIG. 5B shows a positive chirp state of the electron beam at a position B at which a bending angle of the electron beam is changed through the main bending portion 120 and the auxiliary bending portion 140. A graph illustrated in FIG. 5C shows a state in which the pulse of the electron beam is maximally compressed at the position C of the sample portion 150.

The electron beam passing through the sample portion 150 increases in pulse width thereafter. However, electrons are diffracted according to structure information of the sample at the point where the pulse width is maximally compressed (shortest), and are detected by the detection unit 160 in that state.

Further, in the present embodiment, a function in which the ultrafast electron diffraction apparatus 1 compensates (or reduces significantly) timing jitter generated in the photoelectron gun 110 will be described with reference to FIGS. 4 and 6A to 6C.

Figure 6A:
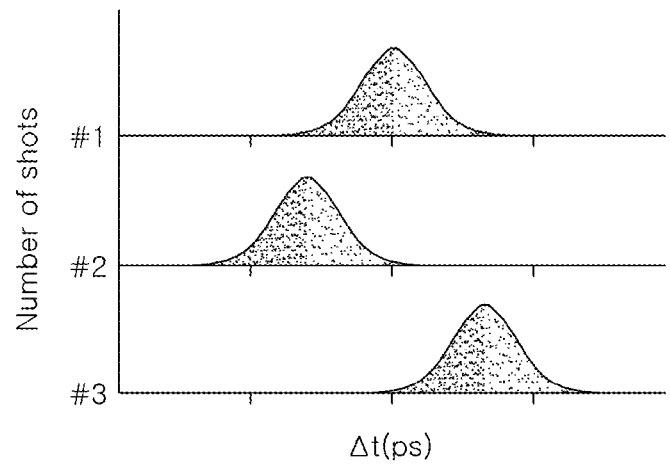
FIGS. 6A to 6C are graphs illustrating a state of relative timing in which an electron beam generated in a photoelectron gun reaches a sample in the ultrafast electron diffraction apparatus according to the embodiment of the present disclosure.
Figure 6B:
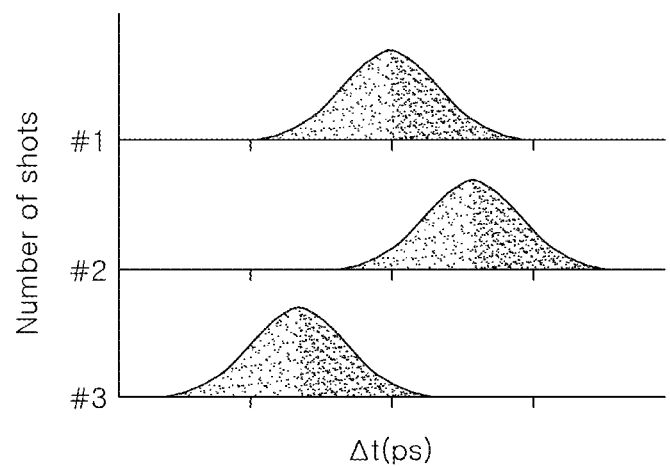
Figure 6C:
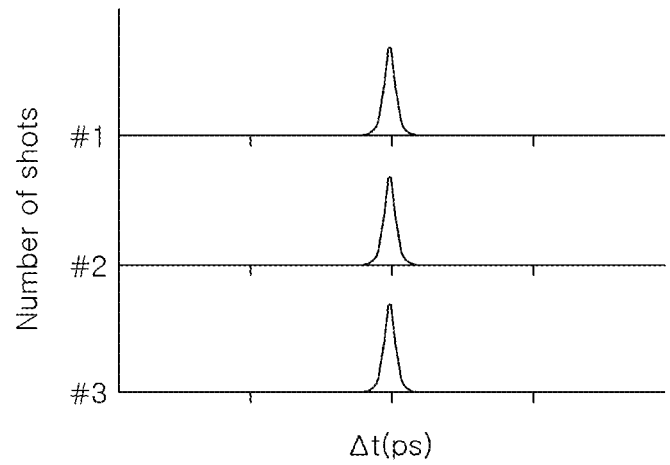

FIGS. 6A to 6C are graphs illustrating a compensating mechanism of timing jitter in which an electron beam generated in a photoelectron gun reaches a sample in an ultrafast electron diffraction apparatus according to the embodiment of the present disclosure.

The photoelectron gun 110 is configured to independently emit an electron beam multiple times at time intervals. These independent electron beams should theoretically have constant average kinetic energy, but actually have different average energies. When the electron beams have different average energies in this way, a flight time, at which the electron beam generated in the photoelectron gun 110 reaches the sample, may also vary. When the photoelectron gun 110 generates an electron beam, a phase of the RF and an incident time of the ultraviolet ray 21 may fluctuate due to various factors. In particular, a change in temperature of the photoelectron gun 110, fluctuation of a phase and power of the incident RF pulse, etc. may be main causes in which average kinetic energy of the electron beam pulse changes. When the ultrafast electron diffraction apparatus 1 has a linear structure, such a change in the average kinetic energy becomes timing jitter in which the electron beam pulse reaches the sample, and as a length of the linear section increases, the timing jitter increases. Due to the change in average kinetic energy of the electron beam, a time varies at which the electron beam pulse exits the photoelectron gun 110. However, as in the present embodiment, the ultrafast electron diffraction apparatus having a bending structure may completely compensate the timing jitter in which the electron beam reaches the sample even if there is a change in the average kinetic energy of the electron beam pulses. The electron beam having high average energy generated in the photoelectron gun 110 quickly exits the photoelectron gun, but conversely, the electron beam takes a relatively longer time because it passes a longer path in the bent structure. Therefore, as these two times cancel each other, when a phase slope of the RF in the photoelectron gun 110 is adjusted, even if there is a change in the average kinetic energy generated in the photoelectron gun 110, it is possible to realize a condition where there is no timing jitter in which the electron beam reaches the sample.

As illustrated in FIG. 6A, at a position A where an electron beam is emitted from the photoelectron gun 110, comparing emission time points at a reference time point of #1 in which the average energy distribution of the electron beam is a relatively intermediate state, #2 in which the average energy distribution of the electron beam is a relatively high state, and #3 in which the average energy distribution of the electron beam is a relatively low state, it can be seen that the electron beam of #2 was emitted at a relatively fast time point and that the electron beam of #3 was emitted at a relatively slow time point and that the electron beam of #1 was emitted at the reference time point.

A graph illustrated in FIG. 6B represents the energy distribution of the electron beam at a position B where an emitting angle of the same electron beam illustrated in FIG. 6A is changed through the main bending portion 120 and the auxiliary bending portion 140. When comparing emission time points at the reference time point of #1 where the average energy distribution of the electron beam is a relatively intermediate state, #2 where the average energy distribution of the electron beam is a relatively high state, and #3 where the average energy distribution of the electron beam is a relatively low state, it can be seen that the electron beam of #2 is arrived at a relatively slow time point and that the electron beam of #3 is arrived at a relatively fast time point and that the electron beam of #1 is arrived at the reference time point.

According to the embodiment of the present disclosure, when electron beams are independently emitted from the photoelectron gun 110 multiple times, even if there is a change in the average kinetic energy by a change in RF phase between each electron beam, as illustrated in FIGS. 6A and 6B, by compensating the time difference in which the electron beams exit the photoelectron gun 110 and the time difference in which the electron beams pass through beamlines passing through the bending portions 120 and 140 and having the linear beamline, timing jitter in which each electron beam reaches the sample may be fundamentally eliminated. In other words, because the electron beam emitted at a time point earlier than the reference time point has a high energy distribution on average, the electron beam moves along a long path (a path with a large radius of curvature) while passing through the bending portions 120 and 140 to be emitted relatively late at the bending portions 120 and 140. Accordingly, an electron beam emitted at a time point earlier than the reference time point may take the same time as the time taken for the electron beam emitted at the reference time point to reach the sample portion 150 by being emitted from the photoelectron gun 110. Further, because an electron beam emitted at a time point slower than the reference time point has a low energy distribution on average, the electron beam moves along a short path (a path with a small radius of curvature) while passing through the bending portions 120 and 140 to be emitted relatively quickly from the bending portions 120 and 140. Accordingly, the electron beam emitted at a time point slower than the reference time point may take the same time as the time taken for the electron beam emitted at the reference time point to reach the sample portion 150 by being emitted from the photoelectron gun 110.

As described above, when the average kinetic energy of the electron beam emitted from the photoelectron gun 110 changes, the time in which the electron beam exits the photoelectron gun 110 changes, but the electron beam is bent in the main bending portion 120 and the auxiliary bending portion 140, respectively and thus a difference in time for the electron beam to reach the sample portion 150 may be canceled.

In the present embodiment, a function of removing a dark current 33 generated in the photoelectron gun 110 will be described with reference to FIG. 7.

Figure 7:
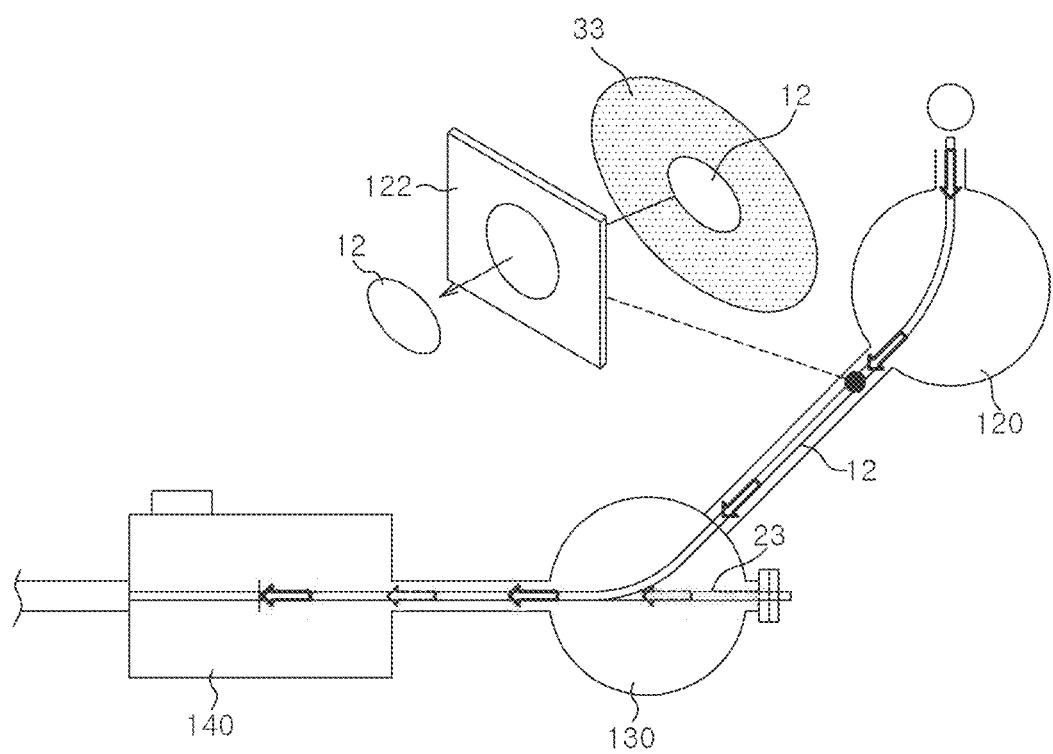
FIG. 7 is a diagram illustrating removal of a dark current and colinear matching of pumping light with electron beam in the ultrafast electron diffraction apparatus according to the embodiment of the present disclosure.

FIG. 7 is a diagram illustrating removal of a dark current and matching of incident trajectories of pumping light with the electron beam at the sample position in an ultrafast electron diffraction apparatus according to the embodiment of the present disclosure.

The photoelectron gun 110 generates an electron beam only when the ultraviolet pulse 21 enter. However, even if the ultraviolet pulse 21 do not enter, when there is an accelerating electric field, electrons having a low current may be generated due to microstructure or impurities of a photocathode surface. The low current electron beam generated in the photoelectron gun 110 is the dark current 33. The dark current 33 has a lower current value than that of the photoelectron beam, but is emitted for much longer time, and thus the dark current 33 may have a level of noise that cannot be ignored.

A photographing time of an intensified charge coupled device (ICCD) or an electron multiplying charge coupled device (EMCCD), which are parts of the detection unit 160 for photographing an electron diffraction pattern, is several nanoseconds to several microseconds, and the photoelectron beam occurs in a time shorter than 1 picosecond, but the dark current 33 may be continuously emitted. Accordingly, in order to remove the dark current 33, as illustrated in FIG. 7, a filter unit 122 capable of passing through only an electron beam may be disposed. In the present embodiment, as the electron beam rotates through the main bending portion 120 and the auxiliary bending portion 140, energy and spatial filter functions may be included in the filter unit 122. Therefore, when the filter unit 122 is disposed in an appropriate position, most of the dark current 33 may be removed. In the present embodiment, it is described that the filter unit 122 is disposed at the rear end of the main bending portion 120, but the filter unit 122 may be additionally installed at the front end of the sample portion 150, as needed. Further, the filter unit 122 may be disposed between the photoelectron gun 110 and the bending portions 120 and 140, and may be disposed between the main bending portion 120 and the auxiliary bending portion 140, as needed.

Further, a description of improving a time performance by matching incident trajectories of the pumping light 23 and the electron beam 12 will be described with reference to FIG. 7.

As illustrated in FIG. 7, when rotating the electron beam 12, it is necessary to match a direction of travel of the electron beam 12 and a direction of travel of the pumping light 23. To this end, when an incident angle of the pumping light 23 is matched to the direction of travel of the electron beam 12, the directions of travel of the electron beam 12 and the pumping light 23 match, so that when passing through the sample, an element that enables time accuracy to be poor may be removed.

In particular, in the case of using an electron beam of relativistic energy, because a velocity of the electron beam almost reaches a velocity of light, it is possible to minimize the effect of expanding a pulse width of the electron beam caused by the velocity difference.

A configuration of an ultrafast electron diffraction apparatus 1 on a space according to another embodiment of the present disclosure will be described.

Figure 8:
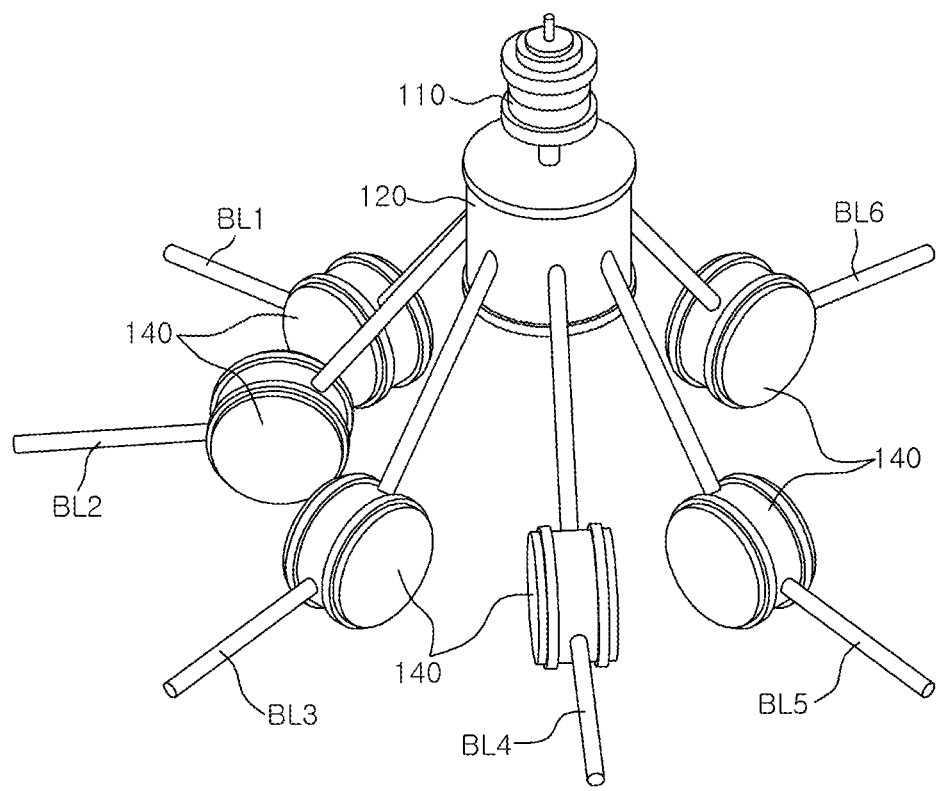
FIG. 8 is a diagram illustrating a configuration of an ultrafast electron diffraction apparatus on a space according to another embodiment of the present disclosure.

FIG. 8 is a diagram illustrating a configuration of an ultrafast electron diffraction apparatus on a space according to another embodiment of the present disclosure.

As illustrated in FIG. 8, one main bending portion 120 is disposed under one photoelectron gun 110. A plurality of auxiliary bending portions 140 may be disposed below the main bending portion 120, and a plurality of sample portions 150 are disposed in an outer direction of the plurality of auxiliary bending portions 140, respectively, so that a plurality of beamlines may be disposed. Accordingly, as illustrated in FIG. 8, virtual lines which are parallel to the plurality of beamlines may be not parallel to one another, and may have an angle of about 90° or a different angle with respect to a virtual line passing through the photoelectron gun 110 and the main bending portion 120 in a three-dimensional space.

In this case, a disposition of the photoelectron gun 110, the main bending portion 120, one auxiliary bending portion 140, and one sample portion 150 may be the same as that on the plane illustrated in FIG. 4. In the present embodiment, it is described that a plurality of beamlines have an angle of 90°, but each beamline may be deformed to have a different angle, as needed, and as the beamline is disposed on a three-dimensional space, an angle of each beamline may be set independently.

Further, as all of the plurality of beamlines have an angle of 90°, dispersion of electron beams in each beamline may be completely compensated.

While the configuration and features of the present disclosure has been shown and described with respect to the embodiments in accordance with the present disclosure, the present disclosure is not limited thereto. It will be apparent to those skilled in the art to make various changes or modifications within the spirit and scope of the present disclosure, and thus, such changes or modifications are found to belong to the appended claims.

What is claimed is:

1. An ultrafast electron diffraction apparatus comprising:
a photoelectron gun configured to emit an electron beam;
a bending portion for bending the electron beam emitted from the photoelectron gun by changing a travel direction of the electron beam by a predetermined angle; and
a sample portion including a sample to be analyzed by the electron beam emitted from the bending portion,
wherein the electron beam reaches the sample portion in a state that a pulse of the electron beam is compressed as the travel direction of the electron beam is changed by the predetermined angle through the bending portion.

2. The ultrafast electron diffraction apparatus of claim 1, wherein the bending portion comprises a main bending portion and a plurality of auxiliary bending portions, and the electron beams passing through the main bending portion and emitted through the respective auxiliary bending portions have travel directions of different angles.

3. The ultrafast electron diffraction apparatus of claim 1, wherein the bending portion comprises a main bending portion and a plurality of auxiliary bending portions, and
the plurality of auxiliary bending portions are disposed to move the electron beam along different paths.

4. The ultrafast electron diffraction apparatus of claim 1, wherein the bending portion comprises a main bending portion and a plurality of auxiliary bending portions, and
at least some of the plurality of auxiliary bending portions are disposed on a virtual plane spaced apart by a predetermined distance from the main bending portion.

5. The ultrafast electron diffraction apparatus of claim 1, wherein the bending portion comprises a main bending portion and a plurality of auxiliary bending portions,
wherein a plurality of beamlines are formed along directions in which the plurality of auxiliary bending portions extend, and
wherein the plurality of beamlines are not parallel to a virtual line passing through the photoelectron gun and the main bending portion.

6. The ultrafast electron diffraction apparatus of claim 1, wherein the electron beam emitted from the bending portion is configured to travel in a straight line toward the sample portion.

7. The ultrafast electron diffraction apparatus of claim 6, wherein the sample portion is disposed at a position in a range in which the electron beam emitted from the bending portion is maximally compressed.

8. The ultrafast electron diffraction apparatus of claim 6, wherein the photoelectron gun is configured to emit a plurality of electron beams, each of the plurality of electron beams being independently emitted at time intervals, and
the sample portion is disposed in a range in which timing jitter generated by an average energy difference between the plurality of electron beams emitted from the bending portion is offset.

9. The ultrafast electron diffraction apparatus of claim 6, further comprising a light source unit for emitting a laser,
wherein a part diverged from the laser emitted from the light source unit enters the photoelectron gun, and
the other part diverged from the laser emitted from the light source unit enters the bending portion as pumping light.

10. The ultrafast electron diffraction apparatus of claim 9, wherein the bending portion comprises a main bending portion and an auxiliary bending portion, and
the pumping light enters the auxiliary bending portion to travel to the sample portion along the electron beam emitted from the auxiliary bending portion.

11. The ultrafast electron diffraction apparatus of claim 9, wherein the light source unit converts a wavelength of the part diverged from the laser into ultraviolet pulses and emits the part to enter the photoelectron gun.

12. The ultrafast electron diffraction apparatus of claim 1, wherein the bending portion comprises a main bending portion and an auxiliary bending portion, and
wherein the ultrafast electron diffraction apparatus further comprises a first quadrupole magnet module disposed between the main bending portion and the auxiliary bending portion to focus the electron beams emitted from the main bending portion.

13. The ultrafast electron diffraction apparatus of claim 1, wherein the bending portion comprises a main bending portion and an auxiliary bending portion, and
wherein the ultrafast electron diffraction apparatus further comprises a second quadrupole magnet module disposed between the auxiliary bending portion and the sample portion to focus the electron beams emitted from the auxiliary bending portion.

14. The ultrafast electron diffraction apparatus of claim 1, further comprising a filter unit disposed between the photoelectron gun and the bending portion to filter a dark current emitted together with the photoelectron beam from the photoelectron gun.

15. The ultrafast electron diffraction apparatus of claim 1, wherein energy of the electron beam emitted from the photoelectron gun is 2 MeV to 4 MeV.

16. The ultrafast electron diffraction apparatus of claim 1, wherein a size of the electron beam emitted from the photoelectron gun is 150 μm to 500 μm, bunch duration is 50 fs to 300 fs, and a bunch charge is 0.1 pC to 5 pC.

17. An ultrafast electron diffraction apparatus comprising:
a photoelectron gun configured to independently emit an electron beam multiple times at time intervals;
a bending portion for bending the electron beam emitted from the photoelectron gun by changing a travel direction of the electron beam by a predetermined angle; and
a sample portion including a sample to be analyzed by the electron beam emitted from the bending portion,
wherein a plurality of electron beams independently emitted to the sample portion and having different average energies reach with timing jitter offset according to selection of a RF phase slope or energy slope of the photoelectron gun and an angle change of the electron beam through the bending portion.

18. The ultrafast electron diffraction apparatus of claim 17, wherein the bending portion comprises a main bending portion and a plurality of auxiliary bending portions,
wherein a plurality of beamlines are formed along directions in which the plurality of auxiliary bending portions extend, and
wherein the plurality of beamlines are not parallel to a virtual line passing through the photoelectron gun and the main bending portion.

* * * * *